(12) United States Patent
Kinoshita

(10) Patent No.: US 8,830,388 B2
(45) Date of Patent: Sep. 9, 2014

(54) OPTICAL MODULE AND METHOD FOR MANUFACTURING OPTICAL MODULE

(75) Inventor: Kazuo Kinoshita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 280 days.

(21) Appl. No.: 13/416,469

(22) Filed: Mar. 9, 2012

(65) Prior Publication Data

US 2012/0243862 A1 Sep. 27, 2012

(30) Foreign Application Priority Data

Mar. 22, 2011 (JP) ................................ 2011-062460

(51) Int. Cl.
*H04N 5/225* (2006.01)
*H01L 27/146* (2006.01)

(52) U.S. Cl.
CPC ........ *H01L 27/14625* (2013.01); *H04N 5/2257* (2013.01); *H01L 27/14685* (2013.01)
USPC ......................................... 348/374; 348/340

(58) Field of Classification Search
CPC ............... H04N 5/2254; H04N 5/2235; H01L 27/14627
USPC .................... 348/335, 340, 373, 374
See application file for complete search history.

(56) References Cited

U.S. PATENT DOCUMENTS

| 6,472,247 | B1* | 10/2002 | Andoh et al. .................... 438/64 |
| 7,528,884 | B2* | 5/2009 | Minamio et al. .............. 348/373 |
| 2007/0183773 | A1 | 8/2007 | Aoki et al. |
| 2007/0252227 | A1* | 11/2007 | Fukuda et al. ................ 257/432 |
| 2009/0230493 | A1* | 9/2009 | Watanabe et al. ............. 257/433 |
| 2010/0149410 | A1 | 6/2010 | Matsuzawa |
| 2011/0063496 | A1* | 3/2011 | Chang .......................... 348/360 |
| 2012/0230670 | A1 | 9/2012 | Hirooka |

FOREIGN PATENT DOCUMENTS

| CN | 102681301 | 9/2012 |
| JP | 2004-342992 | 12/2004 |
| JP | 2006-262072 | 9/2006 |
| JP | 2007-300428 | 11/2007 |
| JP | 2009-3058 | 1/2009 |
| JP | 2009-128890 | 6/2009 |
| JP | 2009-296356 | 12/2009 |
| JP | 2010-141123 | 6/2010 |

* cited by examiner

*Primary Examiner* — Gevell Selby
(74) *Attorney, Agent, or Firm* — Edwards Wildman Palmer LLP; David G. Conlin; Steven M. Jensen

(57) ABSTRACT

In order to attain an optical module which can prevent a foreign object from intruding into the optical module, a camera module includes a top surface section having an opening for allowing light to pass through the opening into the optical module; and a glass substrate for sealing the opening, the glass substrate being adhered to the top surface section, the top surface section including a projection section which projects to abut on the glass substrate, the projection section being formed to surround the opening.

19 Claims, 19 Drawing Sheets

FIG. 1
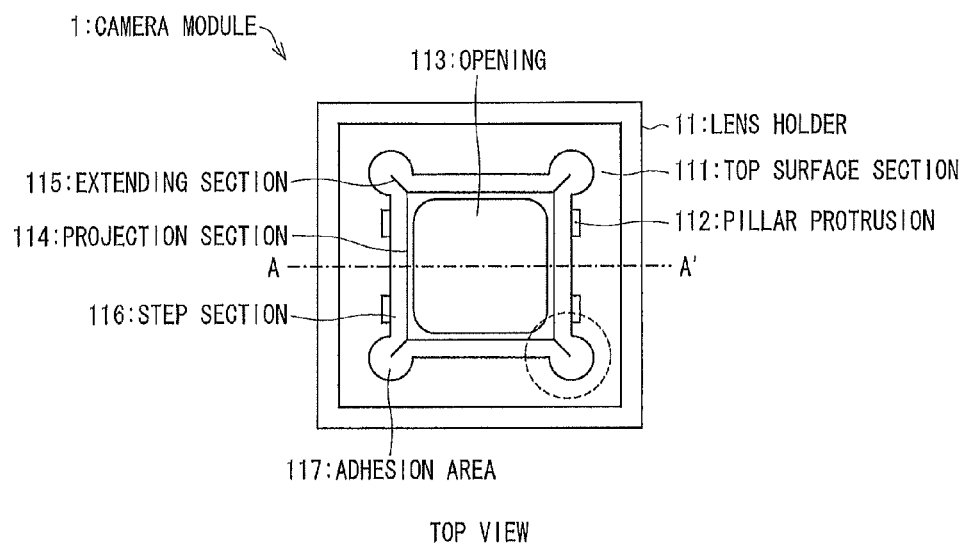
TOP VIEW
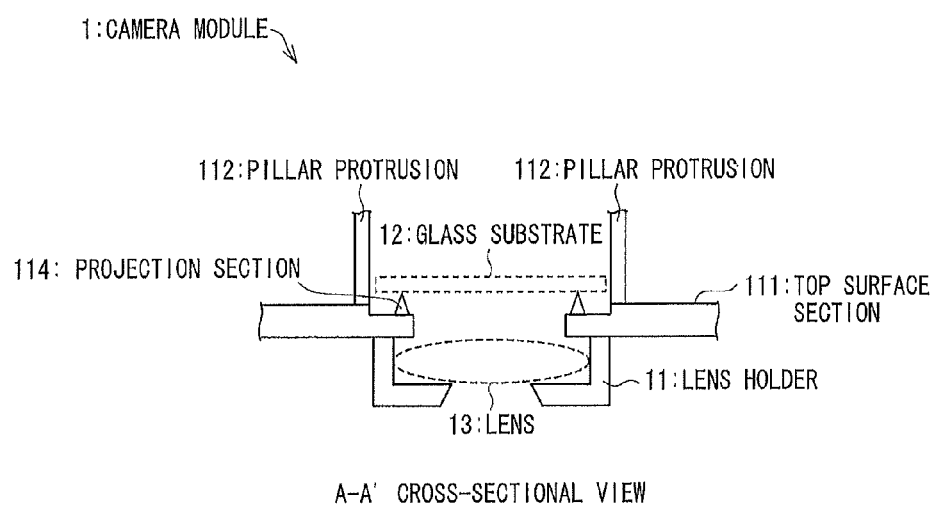
A-A' CROSS-SECTIONAL VIEW

FIG. 5
(a)
DIMENSION OF PROJECTION SECTION (mm)
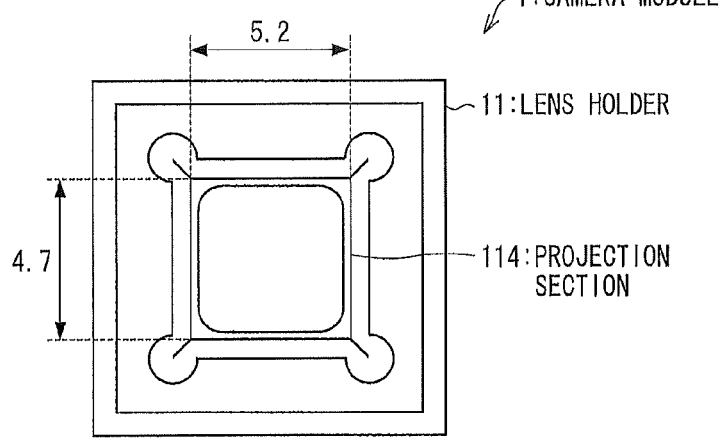
(b)
HEIGHT OF PROJECTION SECTION (mm)
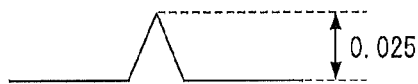
(c)

F I G. 6
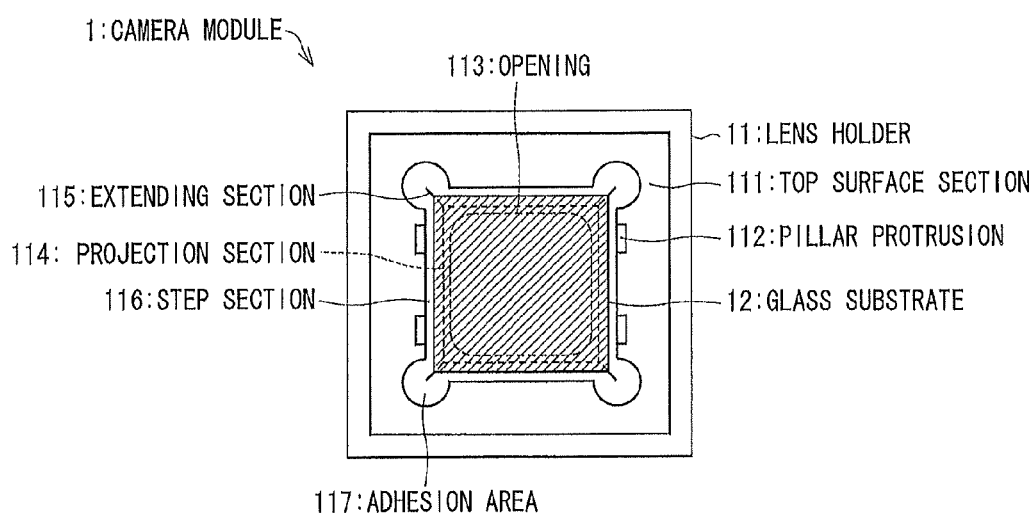

FIG. 13
(a)
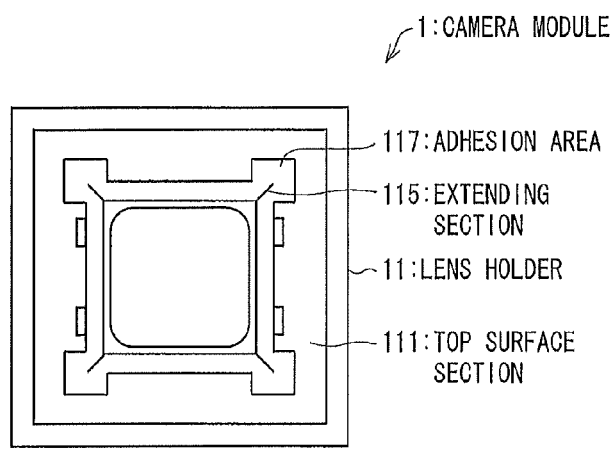
(b)
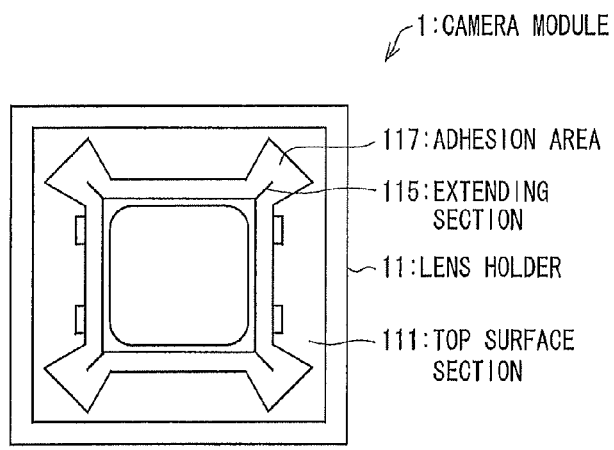

F I G. 1 4
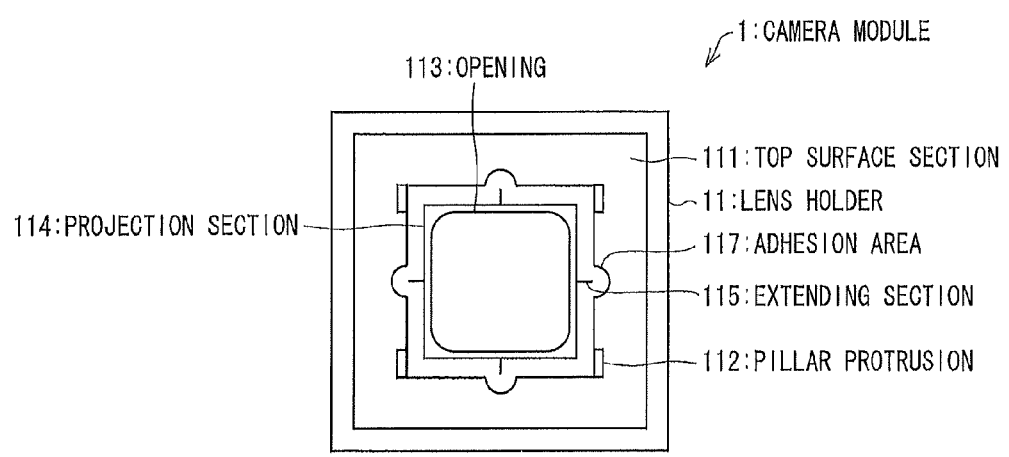

OPTICAL MODULE AND METHOD FOR MANUFACTURING OPTICAL MODULE

This Nonprovisional application claims priority under 35 U.S.C. §119(a) on Patent Application No. 2011-062460 filed in Japan on Mar. 22, 2011, the entire contents of which are hereby incorporated by reference.

TECHNICAL FIELD

The present invention relates to an optical module and a method for manufacturing the optical module.

BACKGROUND ART

A camera module has a problem when a foreign object (trash, dust) intrudes into a region for storing an image pick-up element of the camera module. Recent improvement in image pick-up elements to be able to capturing a higher-resolution image has made the image pick-up elements more vulnerable to such an intruding foreign object, so that, even if a minor foreign object (having a particle size of about 20 μm to 30 μm, for example) is adhered to a light receiving section of the image pick-up element, a micro lens, and the like, a shadow of the foreign object is appeared on an imaging screen as a black spot or a stain. This leads to reduction in image quality. Such a minor foreign object may not be removed because the foreign object catches on asperities of the micro lens. In addition, it may be difficult to detect the foreign object in the camera module at the time of examination, depending on where the foreign object is adhered. These situations are greatly problematic. Therefore, it is important for the camera module not to allow a foreign object (trash, dust) to intrude into the region for storing the image pick-up element of the camera module.

However, it is necessary for the camera module to have an opening for allowing light to pass through the opening into the camera module. In view of this, Patent Literatures 1 to 4 each disclose a technique for sealing an opening with use of a transparent member.

Patent Literature 1 discloses that an ultraviolet curing adhesive is applied to a whole circumference of a top surface section of a package, and the package and a cover glass (transparent member) are fixedly attached to each other.

Patent Literature 2 discloses a method for (i) bringing a pedestal mount and a cover glass (transparent member) into contact with each other via a plurality of ribs formed on the pedestal mount, (ii) positioning the pedestal mount and the cover glass, and then (iii) applying the adhesive to a semilunar cut-out section formed in the pedestal mount. The adhesive applied to the cut-out section is flowed into a whole circumference of the pedestal mount by capillary action. In this way, the pedestal mount and the cover glass are fixedly attached to each other.

Patent Literature 3 discloses a method for adhering a rim-like member and a glass cap to each other by forming a groove in a part of a ring-like adhesive section of the rim-like member, adhering an adhesive to the ring-like adhesive section other than the groove, and placing the glass cap (transparent member) onto the adhesive.

Patent Literature 4 discloses a pedestal which includes abutting sections on respective four corners of a glass cover (transparent member) mounting surface of the pedestal, and a method for adhering the pedestal and the glass cover to each other so that the abutting sections do not allow an adhesive to flowed into an imaging area when the adhesive is applied to adhesive sections.

CITATION LIST

Patent Literatures

Patent Literature 1
Japanese Patent Application Publication, Tokukai, No. 2006-262072 A (Publication Date: Sep. 28, 2006)
Patent Literature 2
Japanese Patent Application Publication, Tokukai, No. 2007-300428 A (Publication Date: Nov. 15, 2007)
Patent Literature 3
Japanese Patent Application Publication, Tokukai, No. 2010-141123 A (Publication Date: Jun. 24, 2010)
Patent Literature 4
Japanese Patent Application Publication, Tokukai, No. 2009-3058 A (Publication Date: Jan. 8, 2009)

SUMMARY OF INVENTION

Technical Problem

However, the conventional arts have a risk that a section of the camera module, in which the opening is provided, and the transparent member, which is adhered to the part, generate a gap therebetween and a foreign object intrudes into the camera module through the gap.

For example, Patent Literatures 1 and 3 disclose techniques for adhering the transparent member to a whole circumference of the opening with use of the adhesive. However, in order to meet demands for miniaturization, higher function, and higher accuracy of mobile devices, a space to which the adhesive is applicable has been reduced in recent years. For example, a protrusion, a component, and the like are formed on a periphery of the opening. The protrusion and the component are, for example, a protrusion which is brought into contact with an image pick-up element so as to position a lens, and an electrical part such as an IC, a resistance, and a capacitor. In a case where such a protrusion or component is formed on the periphery of the opening, the protrusion or the component may intervene in the periphery, i.e., applying an adhesive to the whole circumference becomes difficult. This causes a gap in a portion where the adhesive is not applied, and there is a risk that a foreign object intrudes into a camera module 2 through the gap.

Such possibility will be described below with reference to the drawings. FIGS. 23 to 25 are view illustrating an example of the camera module 2 including a lens holder 21 on which pillar protrusions 212 are formed. The camera module 2 includes a top surface section 211 having an opening 213 for allowing light to pass into the camera module 2. The top surface section 211 is adhered to a glass substrate (transparent member) 22 via an adhesive. Further, the pillar protrusions 212 are provided in the periphery of the opening 213.

As illustrated in FIG. 23, when an adhesive 26 would be applied to an area (dotted line) of a top surface section 211 of the camera module 2, a nozzle for applying the adhesive 26 or an adhesive applicator (dispenser) cannot be reached to the area because the pillar protrusions 212 are provided on the top surface section 211. For this reason, as illustrated in FIG. 24, the top surface section 211 and a glass substrate 22 are adhered to each other in a state in which the adhesive 26 is not applied to peripheries of the pillar protrusions 212.

The adhesives used in the conventional arts generally contain a solid additive (filler) for adjusting viscosity of the adhesive. The solid additive has a particle size of about 20 μm to 30 μm, and accordingly, the adhesive has a thickness of at least the particle size of the solid additive. Therefore, the top surface section 211 and the glass substrate 22, which should be adhered to each other with use of the adhesive, are apart from each other, thereby generating a gap having a distance equal to at least the particle size of the solid additive.

FIG. 25 is a cross-sectional view taken along the dashed line Z-Z' of FIG. 24. As illustrated in FIG. 25, the adhesive 26 is not applied to peripheries of the right and left pillar protrusions 212. Accordingly, there is a risk that the top surface section 211 and the glass substrate 22 generate a gap therebetween and a foreign object intrudes into the camera module 2 through such gap.

Further, Patent Literature 2 discloses a technique in which the pedestal mount and the cover glass (transparent member), which have been adhered to each other, are apart from each other so as to generate a gap to cause capillary action, and the capillary action allows the adhesive to flow around the whole circumference of the pedestal mount. There is a risk that a foreign object intrudes into the camera module through this gap.

Further, as illustrated in FIG. 25, the technique of Patent Literature 4 has such a risk that the top surface section, to which an adhesive is not applied, and the transparent member generate a gap, and a foreign object may be possible to intrude into the camera module through the gap.

As described above, the conventional arts have such a problem that: a gap is generated between the top surface section and the transparent member of the camera module, and a foreign object intrudes into the camera module, so that image quality is deteriorated. In view of the circumstances, there is a demand for a camera module which can successfully prevent the foreign object from intruding into the camera module. Further, the technique for successfully preventing a foreign object from intruding into the camera module is useful not only for the camera module, but also for general optical modules for storing optical parts.

The present invention has been made in view of the aforementioned problem, and a main object of the present invention to provide an optical module which successfully prevents a foreign object from intruding into the optical module.

Solution to Problem

In order to attain the aforementioned object, an optical module of the present invention includes: a top surface section having an opening for allowing light to pass through the opening into the optical module; and a transparent member for sealing the opening, the transparent member being adhered to the top surface section, the top surface section including a projection section which projects to abut on the transparent member, the projection section being formed to surround the opening.

When adhering the top surface section and the transparent member to each other in the conventional arrangement, the top surface section and the transparent member may possibly be apart from each other at an adhesive part due to, for example, a filler basically contained in the adhesive for adhering the top surface section and the transparent member to each other. However, the present invention has such an arrangement that the projection section projecting from the top surface section and the transparent member abut on each other. Therefore, the top surface section and the transparent member can be provided without any gap. Further, the projection section is formed to surround the opening, so that a foreign object intruding from outside is blocked by the projection section. This arrangement makes it possible to prevent a foreign object from intruding into the optical module.

In order to attain the aforementioned object, a method for manufacturing the optical module of the present invention, which method includes: a top surface section having an opening for allowing light to pass through the opening into the optical module, and a transparent member for sealing the opening, the transparent member being adhered to the top surface section, the top surface section including a projection section which projects to abut on the transparent member, the projection section being formed to surround the opening, the method includes: an adhering step for adhering the top surface section and the transparent member to each other.

When adhering the top surface section and the transparent member to each other in the method, the top surface section and the transparent member may possibly be apart from each other at an adhesive part due to a filler basically contained in the adhesive for adhering the top surface section and the transparent member to each other. However, when the top surface section and the transparent member of the optical module having the arrangement are adhered to each other, the projection section projecting from the top surface section and the transparent member abut on each other. Therefore, the top surface section and the transparent member can be provided without any gap. Further, the projection section of the optical module of the aforementioned arrangement is formed to surround the opening, so that a foreign object intruding from the outside is blocked by the projection section. This arrangement makes it possible to manufacture the optical module which can prevent a foreign object from intruding into the optical module.

For a fuller understanding of the nature and advantages of the invention, reference should be made to the ensuing detailed description taken in conjunction with the accompanying drawings.

Advantageous Effects of Invention

An optical module of the present invention includes: a top surface section having an opening for allowing light to pass through the opening into the optical module; and a transparent member for sealing the opening, the transparent member being adhered to the top surface section, the top surface section including a projection section which projects to abut on the transparent member, the projection section being formed to surround the opening. This arrangement makes it possible to prevent a foreign object from intruding into the optical module.

BRIEF DESCRIPTION OF DRAWINGS

FIG. 1

FIG. 1 is a top view of an optical module of Embodiment 1 and a cross-sectional view taken along the dashed line A-A' of the top view.

FIG. 2 is a schematic cross-sectional view of an optical module.

FIG. 3 is an enlarged perspective view of a part enclosed by the broken line of the top view of FIG. 1.

FIG. 4 is a view illustrating an example of a dimension of an opening of an optical module according to Embodiment 1.

FIG. 5

FIG. 5 is a view illustrating an example of a size of a projection section of the optical module according to Embodiment 1: (a) of FIG. 5 shows a length of the projection section; and (b) and (c) of FIG. 5 each show a height thererof.

FIG. 6

FIG. 6 is a top view illustrating an example of an optical module in which a transparent member is provided to a top surface section.

FIG. 7 is a top view illustrating an example of an optical module in which an adhesive is applied to adhesion areas.

FIG. 8 is a view illustrating the optical module of FIG. 7: (a) of FIG. 8 is a cross-sectional view taken along the dashed line B-B' of FIG. 7; and (b) of FIG. 8 is a cross-sectional view illustrating a case where an adhesive of (a) of FIG. 8 is shown transparently.

FIG. 9 is a view illustrating an example of an optical module in which a transparent member is placed in an optical module of FIG. 7.

FIG. 10 is a cross-sectional view taken along the dashed line C-C' of FIG. 9.

FIG. 11 is a cross-sectional view taken along a dashed line C-C' of FIG. 9 when a top surface section and a transparent member are adhered to each other.

FIG. 12 is a view illustrating examples of shapes of a projection section: (a) to (c) of FIG. 12 each illustrate an example where an apex part has a pointed shape; (d) to (f) of FIG. 12 each illustrate an example where an apex part has a round shape.

FIG. 13

FIG. 13 is a view illustrating examples of shapes of adhesion areas: (a) and (b) of FIG. 13 each illustrate an example where adhesion areas are areas each having corners.

FIG. 14

FIG. 14 is a view illustrating an example of positions on which extending sections are formed.

FIG. 15 is a view illustrating examples of shapes of extending sections: (a) and (b) of FIG. 15 each illustrate an example where extending sections have a curved shape.

FIG. 16 is a top view of an optical module when extending sections are fully brought into line contact with a transparent member.

FIG. 17 is a view illustrating an example where a projection section and an extending section are formed into different shapes.

FIG. 18 is a view illustrating other examples of shapes of the projection section: (a) to (g) of FIG. 18 each illustrate an example where the projection section has a flat apex part.

FIG. 19 is a view illustrating other examples of shapes of the projection section: (a) to (g) of FIG. 19 each illustrate an example where the projection section has a flat apex part and a protruding edge.

FIG. 20 is a view illustrating an optical module of Embodiment 2: (a) of FIG. 20 is a view illustrating a top surface section of an optical module of Embodiment 2, which is seen from a wiring substrate side; and (b) of FIG. 20 is an enlarged view of a groove formed on the top surface section.

FIG. 21 is an explanatory view illustrating an example of a step for adhering a top surface section and a transparent member to each other: (a) of FIG. 21 illustrates an example where an adhesive is applied to a glass substrate; and (b) of FIG. 21 illustrates an example where a glass substrate applied with an adhesive is placed on a top surface section.

FIG. 22 is an explanatory view illustrating an example of another step for adhering a top surface section and a transparent member to each other.

FIG. 23 is a top view illustrating an example of an optical module.

FIG. 24 is a top view of an optical module when a transparent member is placed in the optical module of FIG. 23.

FIG. 25 is a cross-sectional view taken along the dashed line Z-Z' of FIG. 24.

DESCRIPTION OF EMBODIMENTS

The present invention provides an optical module. In the present specification, the optical module indicates a module for storing an optical part, for example, an optical element (such as a lens, a mirror, etc.), a light emitting element, a light receiving element, an image pick-up element, and the like. Hereinafter, a case where the present invention is used in a camera module will be described in each embodiment of the present invention. However, the present invention is not limited thereto, and can be suitably used in optical modules in general.

[Embodiment 1]

An embodiment (Embodiment 1) of the present invention will be described below with reference to the drawings.

(Outline of Camera Module 1)

Figure 2:
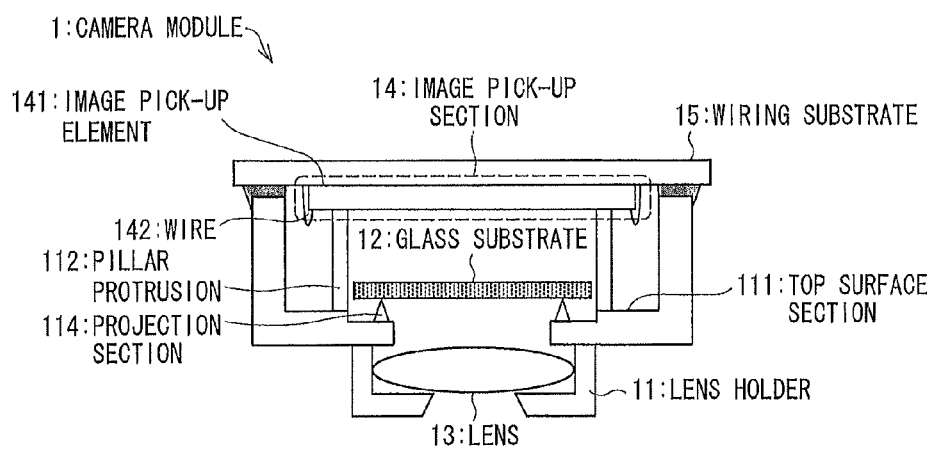
FIG. 2

FIG. 2 is a schematic cross-sectional view of a camera module (optical module) 1 of the present embodiment. As illustrated in FIG. 2, the camera module 1 includes a lens holder 11, a glass substrate (transparent member) 12, a lens 13, an image pick-up section 14, and a wiring substrate 15, and the like.

The lens holder 11 is a mechanism for storing the lens 13 and the image pick-up section 14. The lens holder 11 includes a top surface section 111 and pillar protrusions 112.

The top surface section 111 has an opening 113 for causing light, converged by the lens 13, to penetrate through the lens holder 11. The glass substrate 12 is adhered to the top surface section 11 so as to seal the opening 113. The glass substrate 12 may have an optical filter function that, for example, causes light having only a predetermined property (e.g., light within the range of a specific wavelength) to penetrate and does not cause light other than the light having the predetermined property to penetrate.

The lens 13 is an optical element for converging light. The lens 13 may be arranged to include a movable member having macro, zoom, auto focus, or other functions, or may be arranged to include a plurality of lenses. Alternatively, the lens 13 may be arranged by combining the movable member and the plurality of lenses.

The image pick-up section 14 includes an image pick-up element 141 and a wire 142. The image pick-up element 141 is constituted by, for example, a CCD, a CMOS sensor IC, and the like. The wire 142 is a member for electrically connecting the image pick-up element 141 and the wiring substrate 15 to each other by means of, for example, wire-bonding, by providing a through electrode, or by other means.

For example, the wiring substrate 15 has a surface which is not connected to the image pick-up element 141, or has a side surface on which an electrode (not shown) is provided for electrically connecting to outside.

(Arrangement of Top Surface Section 111)

Figure 3:
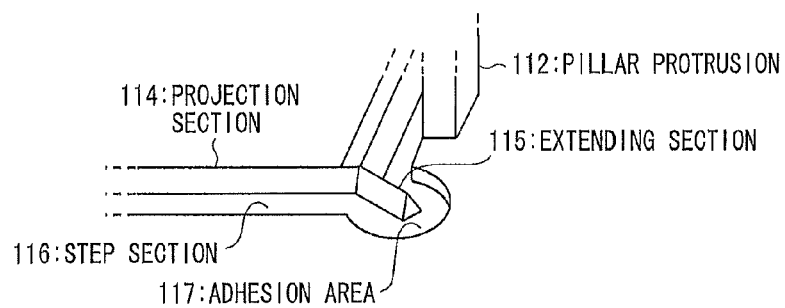
FIG. 3
Figure 4:
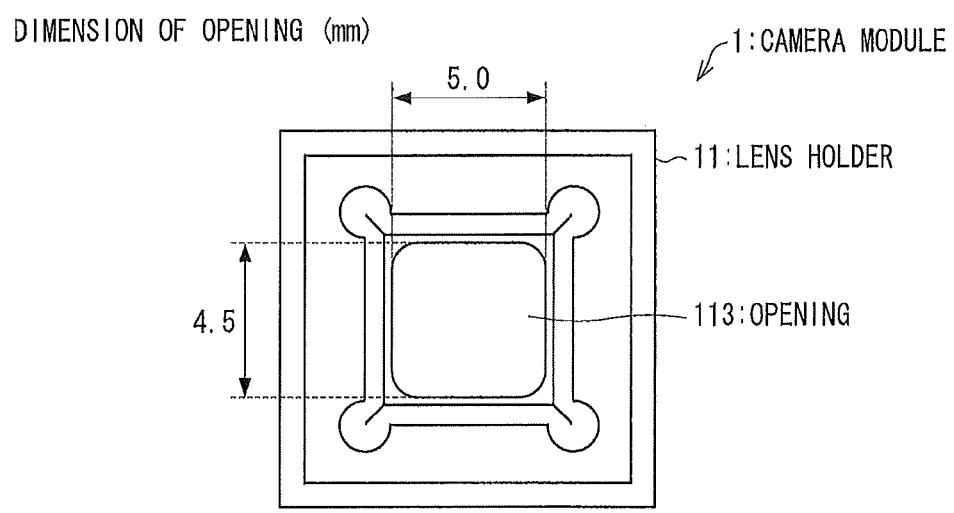
FIG. 4

Next, an arrangement of the top surface section 111 will be described with reference to FIG. 1, and FIGS. 3 to 5. FIG. 1 is a top view of the top surface section 111 of the camera module 1 of FIG. 2, which is seen from a wiring substrate 15 side, and a cross-sectional view taken along the dashed line A-A' of the top view. FIG. 3 is an enlarged perspective view of a part enclosed by a broken line of the top view of FIG. 1. Further, FIG. 4 and FIG. 5 are illustrating an example of a dimension of the opening 113 and a projection section 114, respectively.

As illustrated in FIG. 1 and FIG. 3, the top surface section 111 includes pillar protrusions 112, the opening 113, the projection section 114, extending sections 115, a step section 116, adhesion areas 117, and the like.

The pillar protrusions 112 are brought into contact with the image pick-up section 14 in order to position the lens 13, and project from the top surface section 111 toward the image pick-up section 14. Note that the pillar protrusions 112 are not limited thereto, and may have other function. In an embodiment, for example, a protrusion may be an electrical part such as an IC, a resistor, a capacitor, and the like.

The opening 113 is provided in the top surface section 111 in order to pass light through the camera module 1. That is, the image pick-up element 141 captures an image by receiving outside light via the opening 113. A dimension of the opening 113 is changed depending on the pixel number of the image pick-up element 141, a focal length of the lens 13, and the like. In the present embodiment, the lens 13 of eight million pixels and the lens holder 11 having the opening 113 (having a dimension of 4.5 millimeter long and 5.0 millimeter wide) are used.

The projection section 114 projects to abut on the glass substrate 12 and surrounds the opening 113. The projection section 114 is formed on the step section 116 so as to surround the step section 116 so as to have a substantially square shape or a substantially rectangular shape.

As illustrated in (a) of FIG. 5, the projection section 114 is formed on a position only 0.1 mm far from the opening 113 in the present embodiment. That is, a dimension of the projection section 114 is formed to have 4.7 millimeter long and 5.2 millimeter wide.

Further, in the present embodiment, the projection section 114 has 0.025 millimeter height as illustrated in (b) and (c) of FIG. 5. Furthermore, in the present embodiment, the projection section 114 has a pointed apex part as illustrated in (b) of FIG. 5.

The extending sections 115 are sections each of which extends from the projection section 114 in a direction opposite to the opening 113. As illustrated in FIG. 1, the extending sections 115 extend from respective four corners of the projection section 114 toward the side on which the opening 113 is not provided. Further, as illustrated in FIG. 1, each of the extending sections 115 has a straight shape. Furthermore, the extending sections 115 are formed to be brought into line contact with the glass substrate 12. In the present embodiment, the extending sections 115 have a same shape as the projection section 114.

In order to catch and hold an adhesive applied to the top surface section 111, the step section 116 is recessed more than other sections of the top surface section 111. The step section 116 is formed to surround the opening 113. Further, as illustrated in FIG. 1, the step section 116 is formed to also surround the extending sections 115. Furthermore, as illustrated in FIG. 3, the projection section 114 is formed in an area surrounded by the step section 116.

The adhesion areas 117 are provided for applying the adhesive to the extending sections 115 or peripheries thereof. Each of the adhesion areas 117 includes or is connected to a corresponding extending section 115. The adhesion area 117 is an area surrounded by the step section 116. Since the adhesion area 117 includes or is connected to the extending section 115, the adhesive can be successfully applied to or flowed into the extending section 115.

(Geometric Arrangement Example of Glass Substrate 12)

Next, a geometric arrangement of the glass substrate 12 will be described with reference to FIG. 6. FIG. 6 is a view illustrating an example where the glass substrate 12 provided to the top surface section 111. As illustrated in FIG. 6, the glass substrate 12 is provided to the top surface section 111 so as to seal the opening 113. Further, as illustrated in FIG. 6, the glass substrate 12 abuts on the projection section 114, and also partially or fully abuts on the extending sections 115.

(Method for Manufacturing Camera Module 1)

Next, a method for manufacturing the camera module 1 will be described with reference to FIG. 7 to FIG. 11. The method for manufacturing the camera module of the present invention includes an adhering step for adhering the top surface section 111 and the glass substrate 12 to each other.

Figure 7:
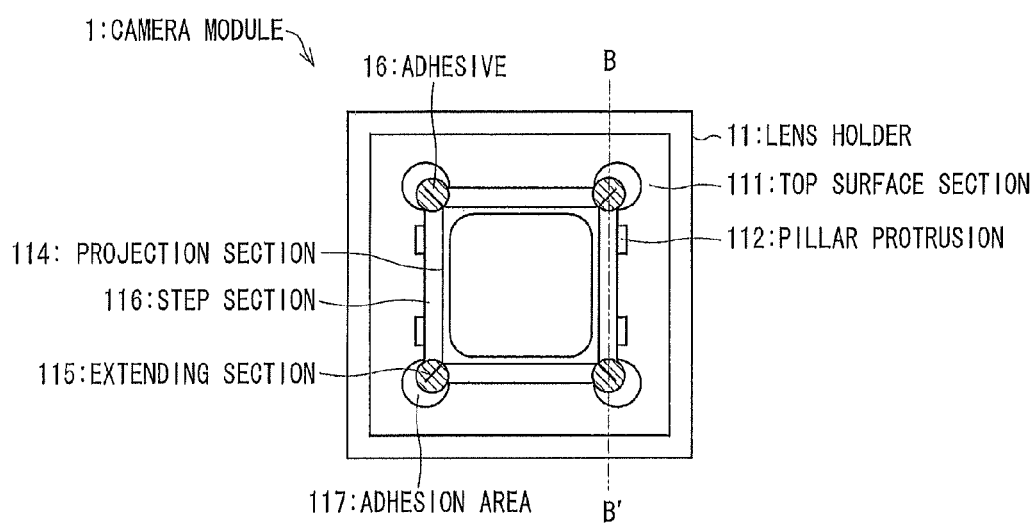
FIG. 7

FIG. 7 is a view illustrating the camera module 1 in which an adhesive 16 is applied to the adhesion areas 117. As illustrated in FIG. 7, the adhesive 16 is applied to the adhesion areas 117 which include the respective extending sections 115 formed on the four corners of the projection section 114.

Note that the adhesive 16 of the present embodiment contains a solid additive (for example, a filler) 161. The solid additive is an additive for adjusting viscosity of the adhesive 16. In the present embodiment, the adhesive 16 contains the solid additive 161 having a particle size of about 20 μm to 30 μm.

Figure 8:
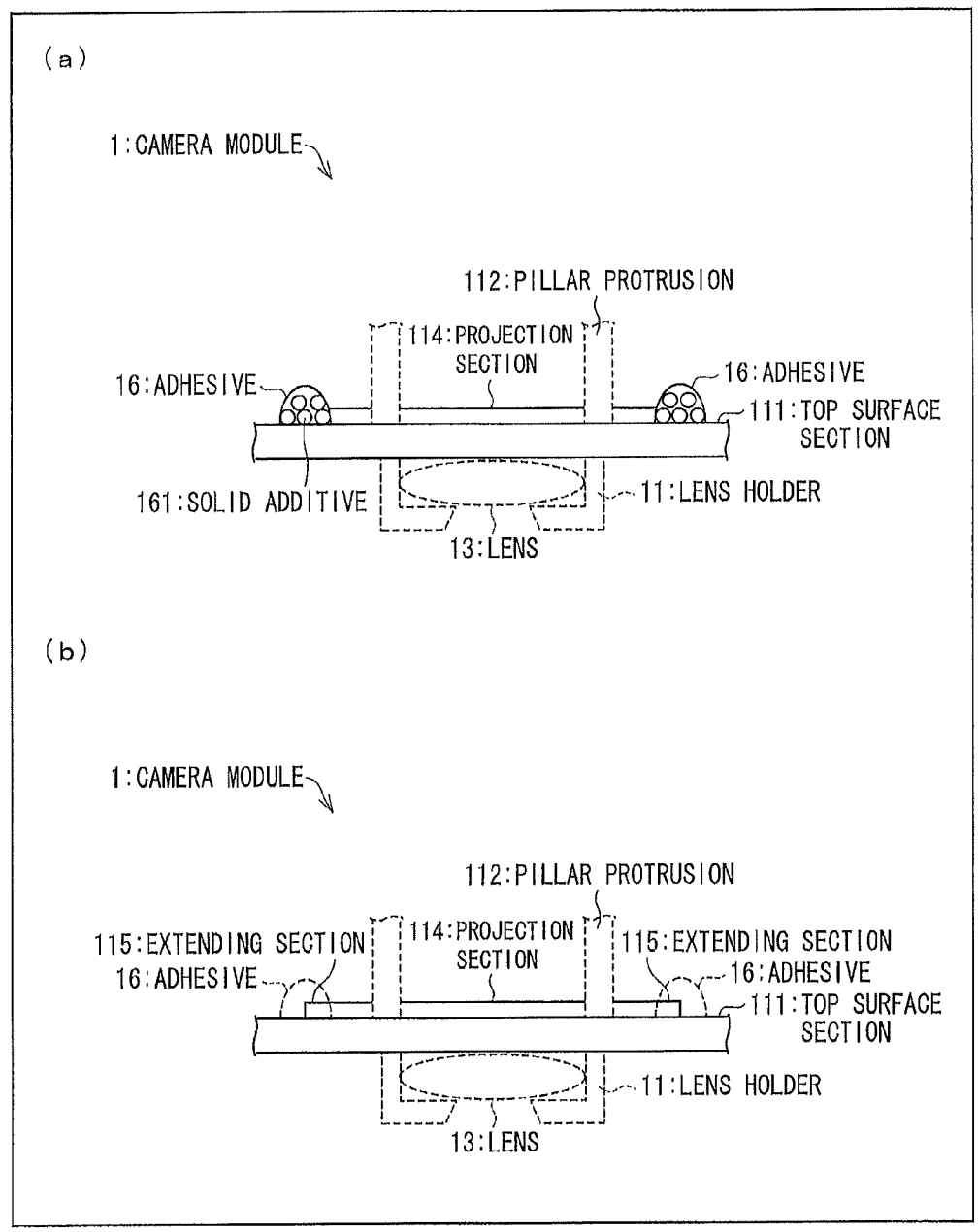
FIG. 8

(a) of FIG. 8 is a cross-sectional view taken along the dashed line B-B' of FIG. 7. Further, (b) of FIG. 8 is the cross-sectional view illustrating a case where the adhesive 16 of (a) of FIG. 8 is shown transparently.

As illustrated in (a) and (b) of FIG. 8, the adhesive 16 is applied to the adhesion areas 117, including the extending sections 115, respectively, so that the adhesive 16 is thick enough to be higher than the height of the extending sections 115. However, the amount of the adhesive 16 is adjusted so that the adhesive 16 does not overflow the projection section 114 into the opening 113. In the present embodiment, the adhesive 16 of about 0.02 mm$^3$ is applied to every adhesion area 117. The adhesion areas 117 are four as illustrated in FIG. 7, so that the adhesive 16 of about 0.08 mm$^3$ in total is applied to the four adhesion areas 117.

Figure 9:
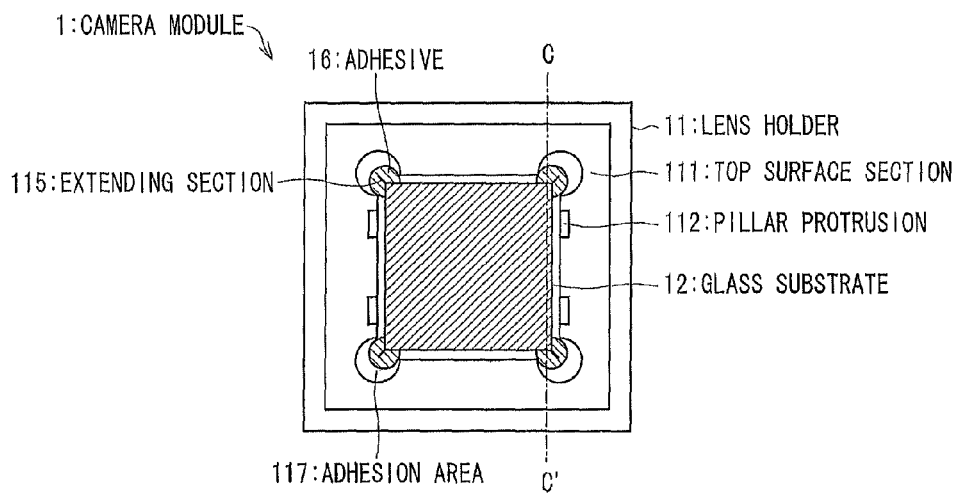
FIG. 9
Figure 10:
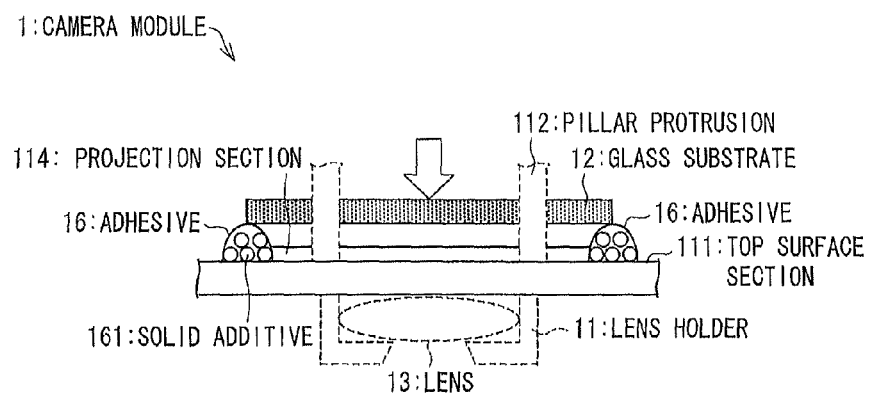
FIG. 10

FIG. 9 is a view illustrating an example where the glass substrate 12 is placed in the camera module 1 of FIG. 7. As illustrated in FIG. 9, the glass substrate 12 is provided to the top surface section 111 so as to seal the opening 113. In this way, four corners of the glass substrate 12 are brought into contact with the adhesive 16. FIG. 10 is a cross-sectional view taken along the dashed line C-C' of FIG. 9 in this case.

As illustrated in FIG. 10, both ends of the glass substrate 12 are brought into contact with the adhesive 16. In this case, as illustrated by an arrow of FIG. 10, the glass substrate 12 is moved in downward direction (i.e., a direction in which the glass substrate 12 is directed to the top surface section 111) by a self-weight of the glass substrate 12.

Figure 11:
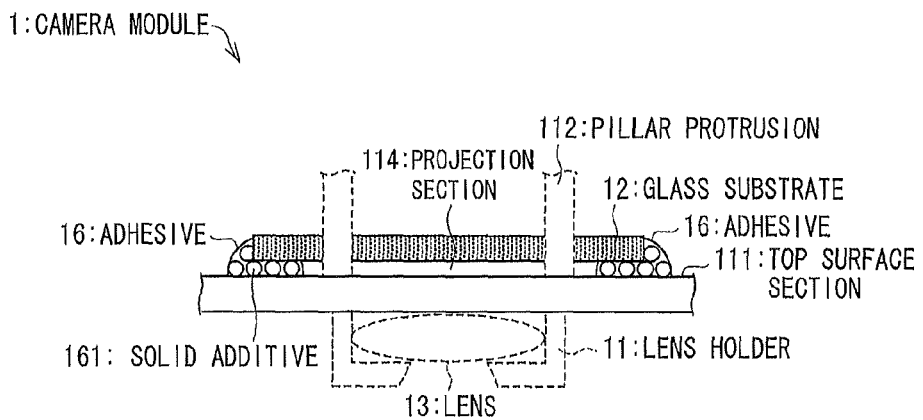
FIG. 11

FIG. 11 is a cross-sectional view taken along the dashed line C-C' of FIG. 9, illustrating a case where the top surface section 111 and the glass substrate 12 are adhered to each other. As illustrated in FIG. 11, the glass substrate 12 is moved to a height equal to that of the projection section 114 to thereby abut on the projection section 114. A part of the adhesive 16, which is pushed by the glass substrate 12, flows from the adhesion areas 117 (on which the extending sections 115 are formed) into the step section 116 (on which the projection section 114 is formed). Therefore, an area on which the adhesive 16 is flowed extends on the top surface section 111. In this way, the top surface section 111 and the glass substrate 12 are adhered to each other.

When adhering the top surface section 111 and the glass substrate 12 to each other as illustrated in FIG. 11, the top surface section 111 and the glass substrate 12 may possibly be apart from each other at an adhesive part due to, for example, the solid additive 161 basically contained in the adhesive 16. However, the projection section 114, which projects from the top surface section 111, and the glass substrate 12 abut on each other. Therefore, the top surface section 111 and the glass substrate 12 can be provided without any gap. Further, the projection section 114 is formed to surround the opening 113, so that a foreign object intruding from the outside is blocked by the projection section 114. This arrangement makes it possible to prevent a foreign object from intruding into the camera module 1.

Conventionally, in a case where the top surface section 111 and the glass substrate 12 have been connected to each other via the adhesive 16, a contact surface between the top surface section 111 and the glass substrate 12 have been increased. For example, in a case where the top surface section 111 and the glass substrate 12 have been brought into contact with each other in a state in which the adhesive 16 has been applied to a whole circumference of the opening 113 having 4.5 millimeter long and 5.0 millimeter wide, the amount of the adhesive 16, which is to be applied to the whole circumference, is about 3.1 mm$^3$. Meanwhile, in the present embodiment, the extending sections 115 are provided as described above, so that the top surface section 111 and the glass substrate 12 can be adhered to each other via the extending sections 115. The amount of the adhesive 16, which is used in this case, is about 0.08 mm$^3$. The camera module 1 having enough adhesive strength can be manufactured with use of the adhesive 16 having only about 0.08 mm$^3$. That is, the amount of the adhesive 16 necessary for adhering the top surface section 111 and the glass substrate 12 to each other can be reduced in the present embodiment. In addition, the top surface section 111 and the glass substrate 12 can be adhered to each other by applying the adhesive to the small adhesion areas 117, without greatly reducing the adhering strength.

Further, in a case where the contact surface has low smoothness, the contact surface causes a gap therein as the contact surface is increased. When the contact surface generates the gap therein, there is a risk that a foreign object intrudes through the gap. In order not to generate the gap, preferable is a small contact surface as much as possible. When the projection section 114 to abut on the glass substrate 12 is provided as described above, the contact surface is reduced. This makes it possible to reduce the gap. In addition, it becomes easier to check (supervise) as to whether a gap is generated in the contact surface or not.

For a similar reason, the extending sections 115 are brought into line contact with the glass substrate 12, and the adhesive 16 for adhering the extending sections 115 and the glass substrate 12 to each other is extruded between the extending sections 115 and the glass substrate 12. This makes it possible to prevent a gap which is caused by the solid additive 161 such as a filler of the adhesive 16 remaining between the extending sections 115 and the glass substrate 12, and also to prevent a foreign object from intruding into the camera module 1.

Alternatively, the top surface section 111 and the glass substrate 12 may be adhered to each other by pushing a surface of the glass substrate 12, which surface is opposite to a surface with which the top surface section 111 is in contact (i.e., a top surface section of the glass substrate 12 in FIG. 11). The viscosity of the adhesive 16 may possibly be to change depending on change in temperature or/and humidity. Further, the viscosity of the adhesive 16 may be also possible to change depending on a kind of materials or a proportion of combination of materials. In a case where the viscosity of the adhesive becomes high as described above, the top surface section 111 and the glass substrate 12 may not be fixedly attached to each other only by a self-weight of the glass substrate 12. Even in such a case, the top surface section 111 and the glass substrate 12 can be fixedly attached to each other by pushing the surface of the glass substrate 12, which surface is opposite to the surface with which the top surface section 111 is in contact.

Further, the step section 116 formed in the present invention can catch and hold an adhesive 16 which has been excessively applied. That is, the present invention can prevent such excessively applied adhesive 16 from overflowing the projection section 114 to intrude toward an opening 113 (drip prevention).

Further, as illustrated in FIG. 11, the projection section 114 and the glass substrate 12 may be partially adhered to each other. As illustrated in FIG. 11, the top surface section 111 and the glass substrate 12 may be adhered to each other by providing the adhesive 16 between the extending sections 115 and the projection section 114.

In this way, the adhesive 16 can be prevented from flowing from the adhesion areas 117 over the projection section 114 to intrude into the opening 113, and the adhesive 16 thus applied can be used for adhering the top surface section 111 and the glass substrate 12 to each other.

(Height of Projection Section 114)

The projection section 114 has 0.025 millimeter height in the present embodiment as described above, however, the height of the projection section 114 is not limited thereto. The projection section 114 is only required to have a height equal to or larger than the particle size of the solid additive 161 contained in the adhesive 16 for adhering the top surface section 111 and the glass substrate 12 to each other.

In a case where the projection section 114 has a height smaller than the particle size of the solid additive 161, a difference between the height of the projection section and the height of the solid additive 161 becomes a gap. Accordingly, when the height of the projection section 114 is equal to or larger than the particle size of the solid additive 161, generation of the gap can be prevented.

(Shape of Projection Section 114)

Figure 12:
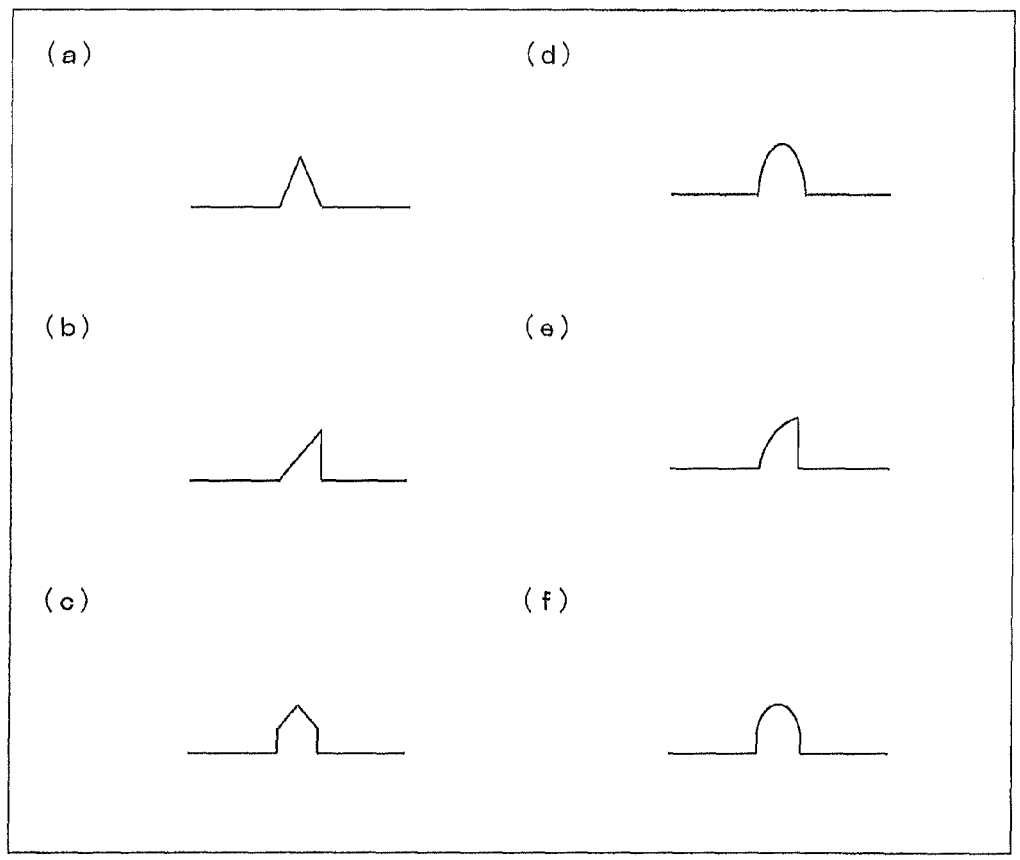
FIG. 12

The example where the projection section 114 has a pointed apex part has been described in the present embodiment, however, a shape of the projection section 114 is not limited thereto. The projection section 114 may be formed to have a pointed apex part as illustrated in (a) to (c) of FIG. 12, or alternatively, may be formed to have a round apex part as illustrated in (d) to (f) of FIG. 12. As described above, the projection section 114 is preferably formed so that the residual solid additive 161 does not exist on the apex of the projection section 114 when the projection section 114 abuts on the glass substrate 12.

In view of this, the projection section 114 does not allow the solid additive to exist on the apex of the projection section 114. This makes it possible to prevent the gap from generating between the top surface section 111 and the glass substrate 12.

(Shape of Adhesion Areas 117)

In the present embodiment, a shape of the adhesion areas 117 is not limited to a circle illustrated in FIG. 1. The adhesion areas 117 may be an area having corners as illustrated in (a) and (b) of FIG. 13, or alternatively, may be an area having other shape. The adhesion areas 117 only need to have such a shape that an adhesive can be applied to the extending sections 115 or the peripheries thereof.

(Position where Extending Sections 115 are Formed)

A case where the extending sections 115 extend from the respective four corners of the projection section 114 toward the side on which the opening 113 is not provided has been described in the present embodiment, however, the position where the extending sections 115 can extend is not limited thereto. For example, in a case where the pillar protrusions 112 are formed on peripheries of respective four corners of the opening 113 as illustrated in FIG. 14, the extending sections 115 may extend from respective four sides of the projection section 114 (having a substantially square shape or a substantially rectangular shape) in a direction opposite to the opening 113, in order to avoid the pillar protrusions 112.

Even in a case where constituent members such as the pillar protrusions 112 are provided in the periphery of the opening 113 as described above, the extending sections 115 can be formed on arbitrary positions. This makes it possible to improve a freedom of design of the camera module 1. Further, the extending sections 115 are formed to extend from the four corners, four sides, or other positions, i.e., the extending sections 115 can be placed appropriately.

(Shape of Extending Sections 115)

Figure 15:
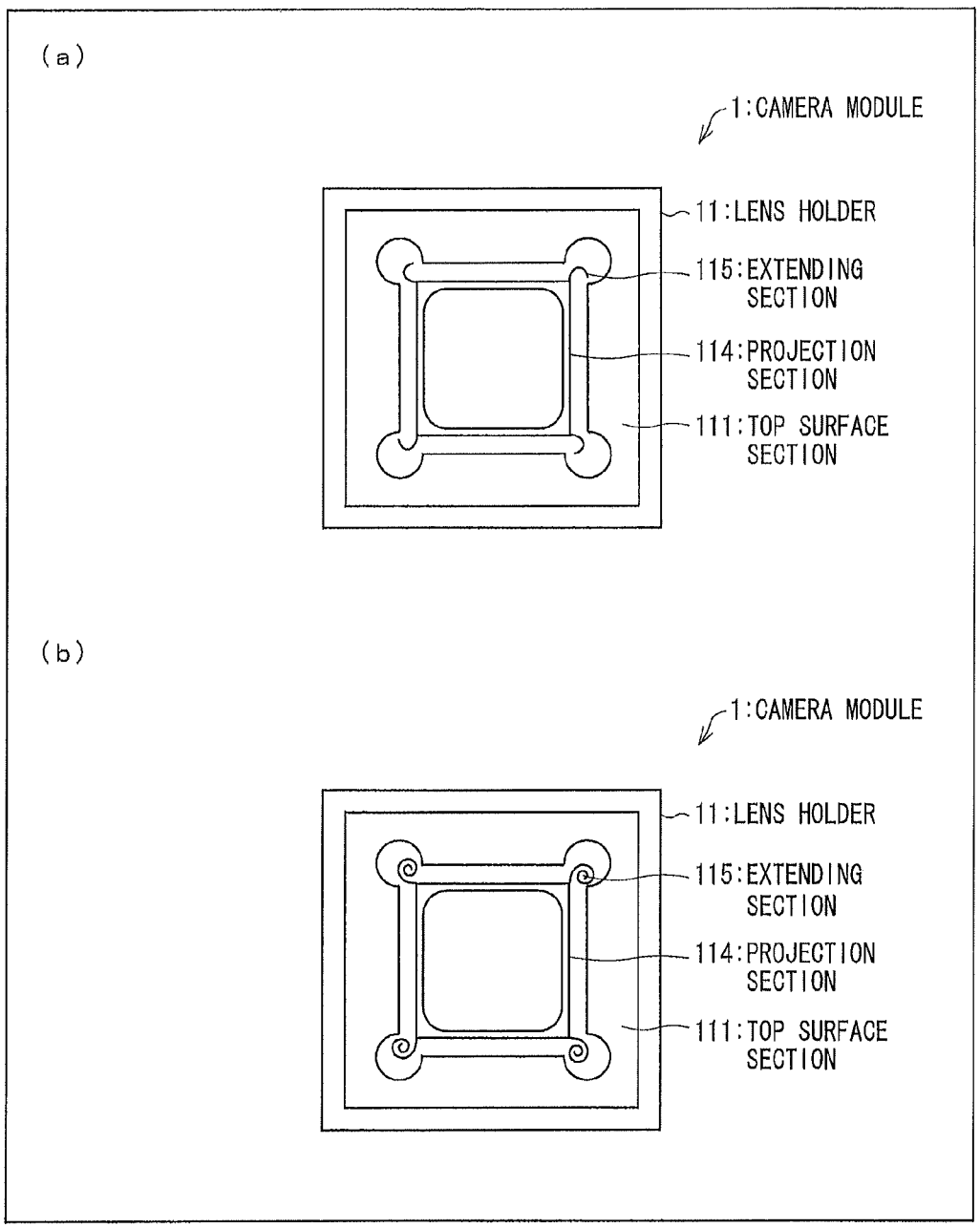
FIG. 15

The example where extending sections 115 have a straight shape has been described in the present embodiment, however, a shape of the extending sections 115 is not limited thereto. As illustrated in (a) and (b) of FIG. 15, the extending sections 115 may be formed to have a curved shape. Accordingly, the extending sections 115 are easy to catch and hold the adhesive 16 in the peripheries of the extending sections 115.

(Parts of Extending Sections 115, the Parts being Brought into Line Contact with Glass Substrate 12)

Figure 16:
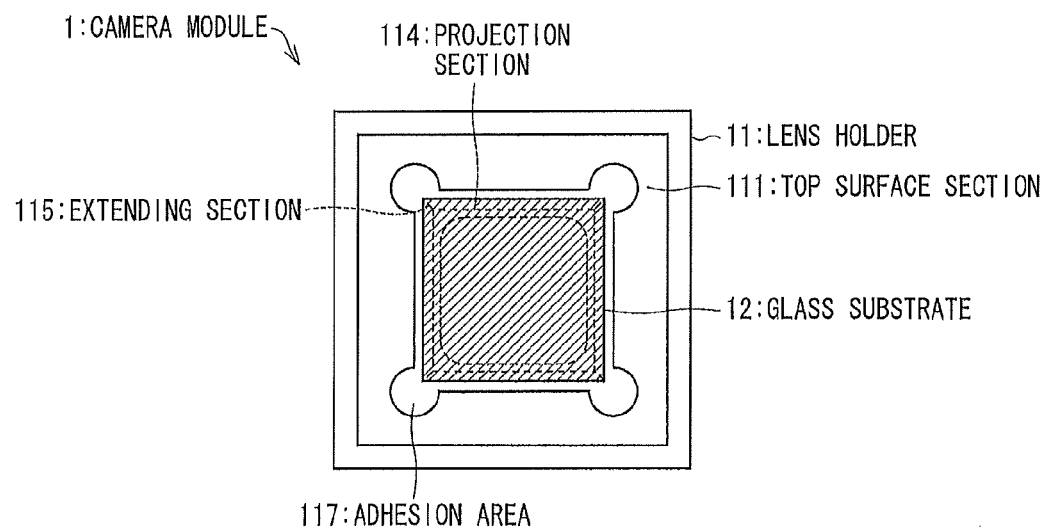
FIG. 16

As illustrated in FIG. 1, the example where each extending section 115 is partially brought into line contact with the glass substrate 12 has been described in the present embodiment, however, the present invention is not limited thereto. As illustrated in FIG. 16, the whole extending sections 115 may be brought into line contact with the glass substrate 12.

A dimension of the extending sections 115 is changeable as described above, so that the extending sections 115 can be formed even if the camera module 1 is small. In other words, the extending section 115 can be formed to be small. This can lead to miniaturization of the camera module 1.

(Shapes of Projection Section 114 and Extending Sections 115)

An example where the projection section 114 and the extending sections 115 have the same shape has been described in the present embodiment, however, the present invention is not limited thereto. That is, the projection section 114 and the extending sections 115 may be formed to have different shapes. In other words, a cross-sectional shape vertical to a longitudinal direction of the projection section 114 and a cross-sectional shape vertical to a longitudinal direction of the extending sections 115 may be different shapes.

Figure 17:
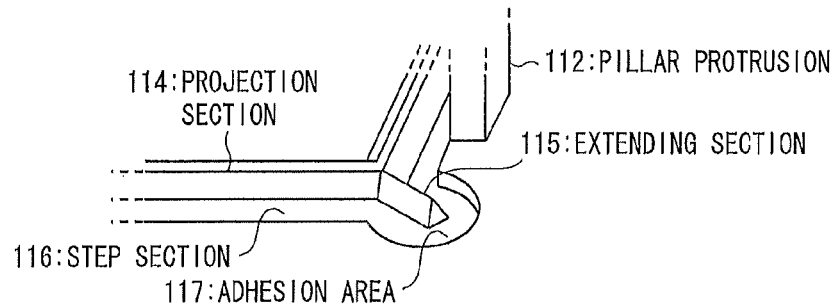
FIG. 17

FIG. 17 illustrates an example where the projection section 114 and the extending sections 115 have different shapes. As illustrated in FIG. 17, the extending sections 115 are each formed to have a pointed apex part. Meanwhile, the projection section 114 is formed to have a flat apex part. Note that, in this case, the projection section 114 and the extending sections 115 have an equal height.

The extending sections 115 has a shape which can be brought into line contact with the top surface section 111 and the glass substrate 12 without leaving the solid additive 161 on apexes of the extending sections 115. In a case where the projection section 114 and the extending sections 115 have the same height, the projection section 114 and the glass substrate 12 abut on each other without any gap even if the projection section 114 has a flat apex part, as long as the adhesive 16 is not flowed to the projection section 114. This makes it possible to prevent a foreign object from intruding into the camera module 1.

Figure 18:
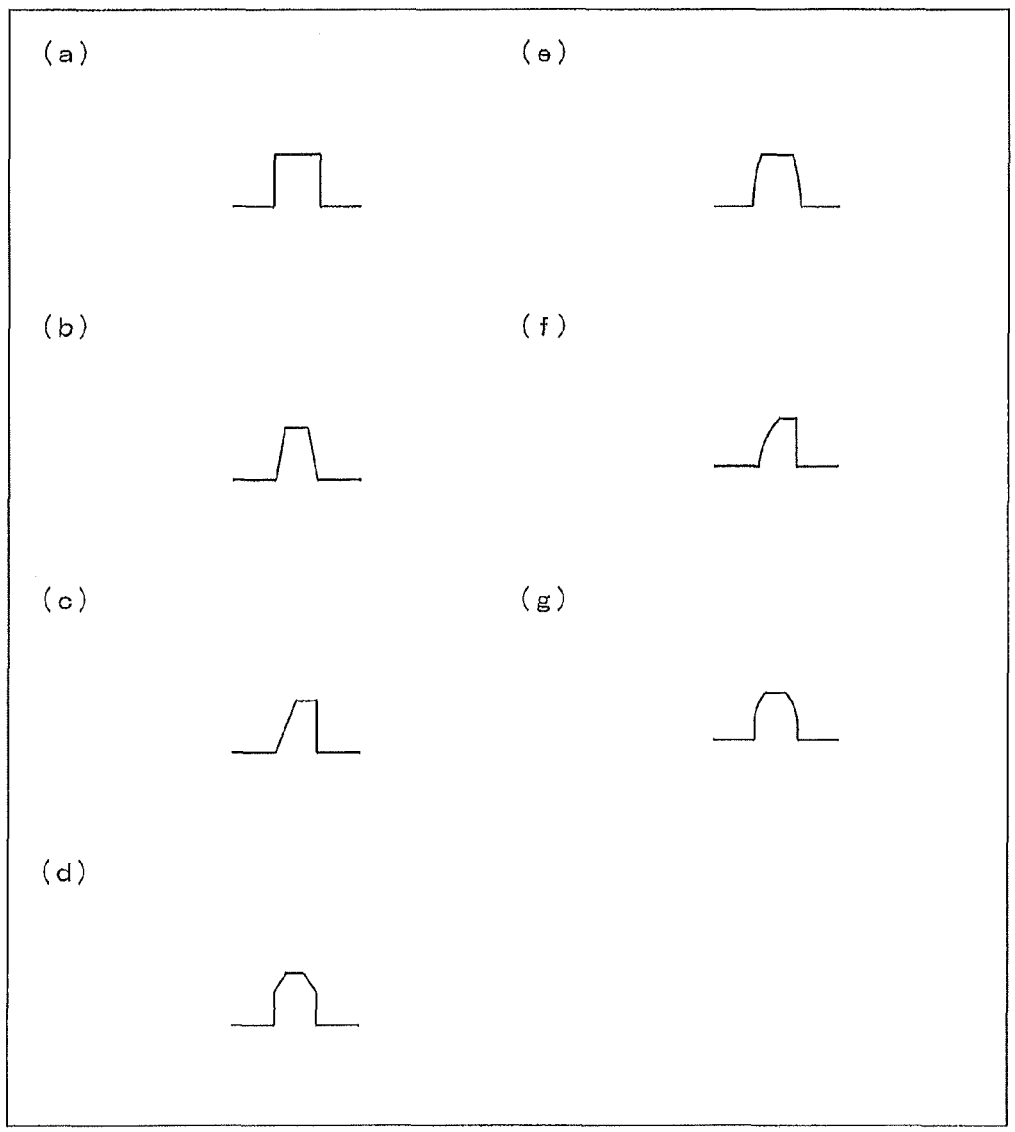
FIG. 18
Figure 19:
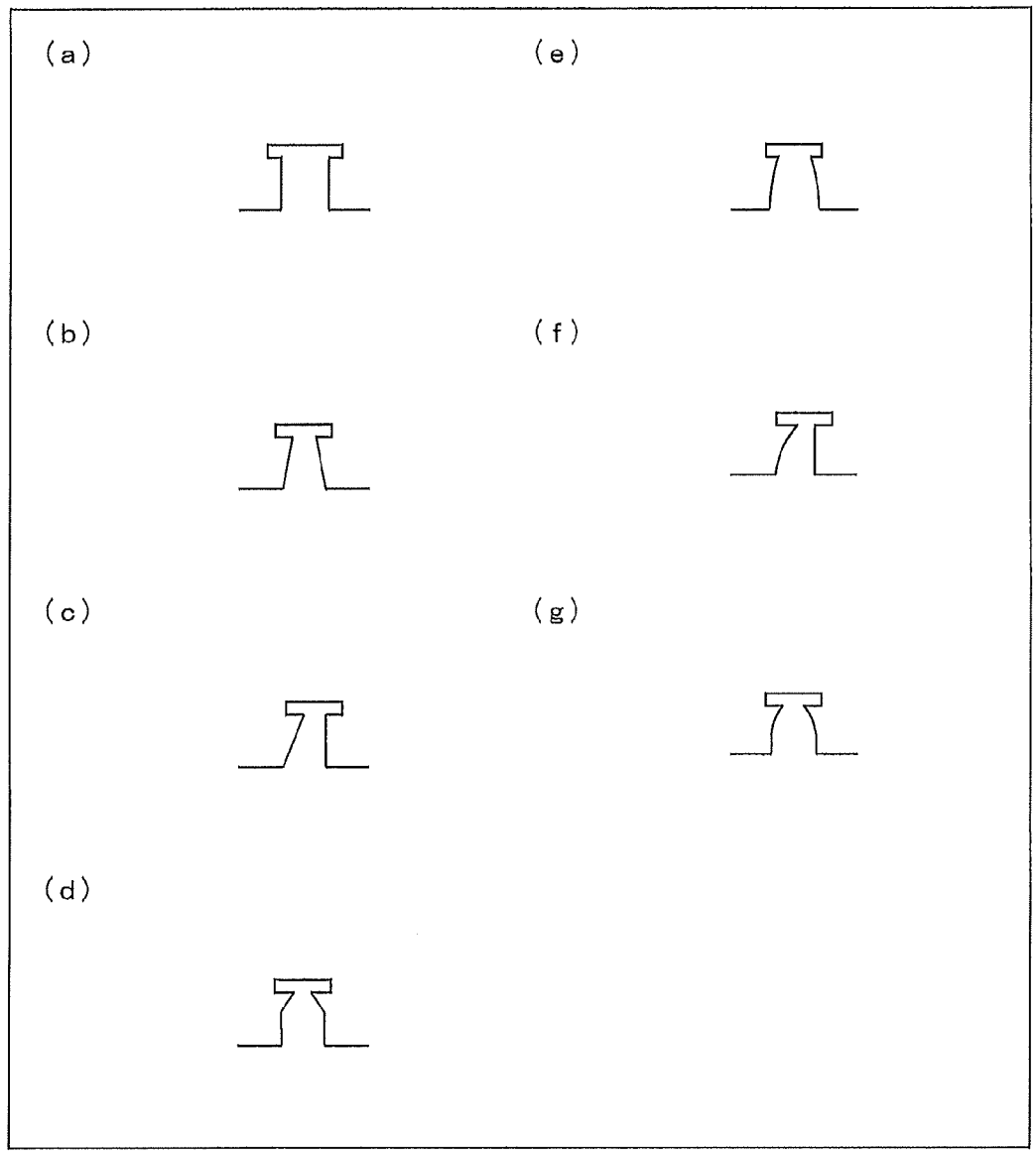
FIG. 19

(a) to (g) of FIG. 18 each illustrate an example of a shape of the projection section 114. As illustrated in (a) to (g) of FIG. 18, the projection section 114 can have a flat apex part. Further, (a) to (g) of FIG. 19 each illustrate an example of a shape of the projection section 114 which has a flat apex part and a protruding edge (flow blocking section). Even in a case where the adhesive 16 applied to the extending sections 115 or the peripheries thereof flows over the step section 116 toward the projection section 114, the protruding edge of the projection section 114 illustrated in (a) to (g) of FIG. 19 can prevent the adhesive 16 from flowing (creeping) to the apex part of the projection section 114. The projection section 114 can be formed to have various shapes as described above, so that a freedom of design of the camera module 1 is improved.

[Embodiment 2]

The camera module 1 is attached to a product substrate of a mobile phone handset etc. by means of solder heating and the like. In this case, an air inside the camera module 1 may possibly expand. In a technique of Embodiment 1, such expansion may possibly cause the glass substrate 12 etc. to peel off and fall down from the camera module 1. In view of the circumstances, a camera module 1' which prevents expansion of an air inside the camera module 1' will be described in the present embodiment with reference to FIG. 20. Note that, for the sake of easy explanation, members having the like functions as the drawings described in Embodiment 1 are denoted by the like reference signs and the detailed description thereof is omitted.

Figure 20:
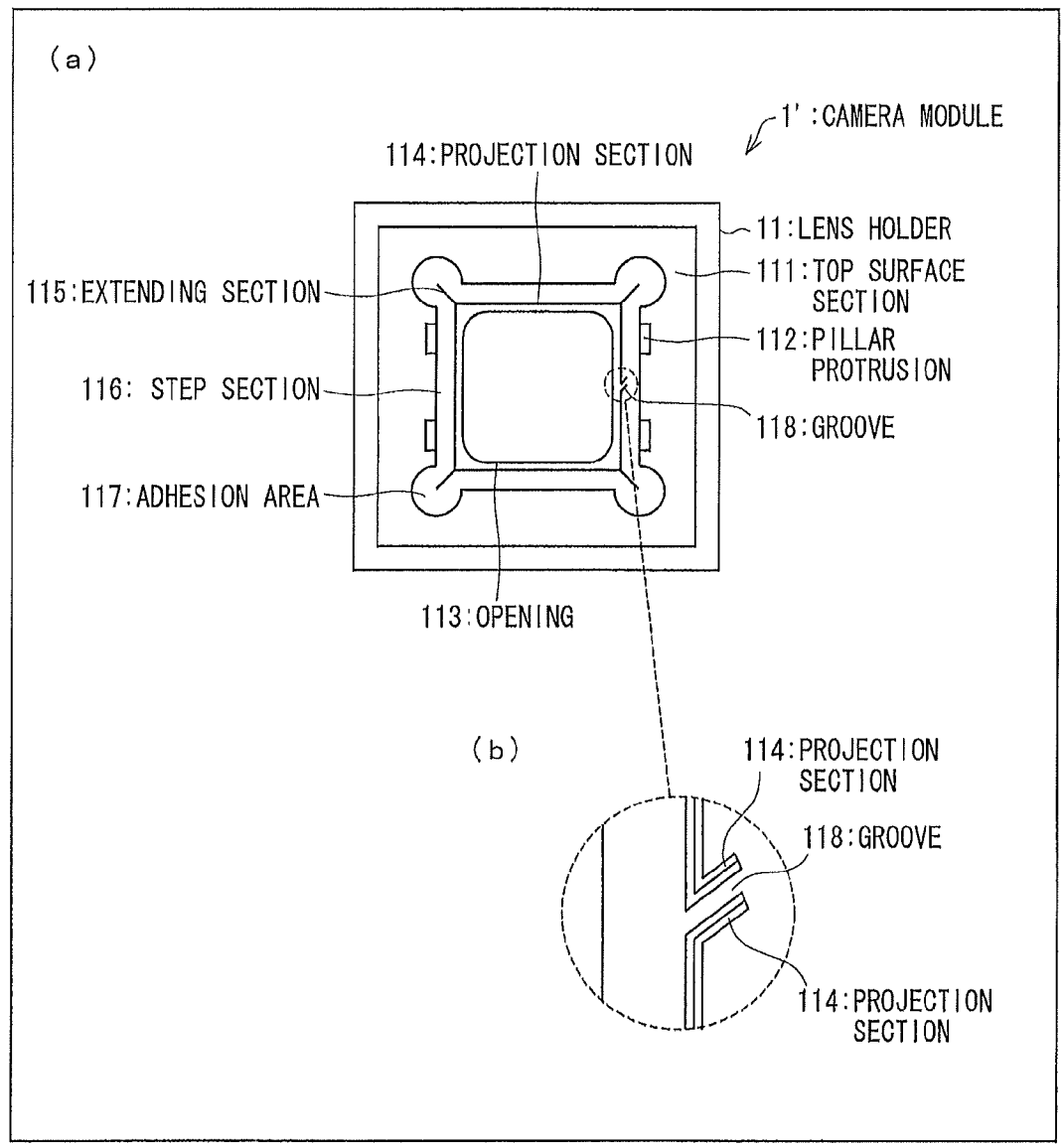
FIG. 20

(a) of FIG. 20 is a top view of a top surface section 111 of the camera module 1', which is seen from a wiring substrate 15 side. As illustrated in FIG. 20, the top surface section 111 includes pillar protrusions 112, an opening 113, a projection section 114, extending sections 115, a step section 116, adhesion areas 117, a groove 118, and the like.

(b) of FIG. 20 is an enlarged view illustrating the groove 118. As illustrated in (b) of FIG. 20, the groove 118 has a mechanism for discharging the air inside the camera module 1' to outside, and is formed in the projection section 114. In order that a foreign object (for example, the foreign object such as a solid additive 161), which is supposed to intrude into the camera module 1', cannot intrude into the camera module 1', the groove 118 is basically formed to have a width smaller than a particle size of the foreign object thus supposed to intrude.

Note that, for example, in a case where the groove 118 is formed in the periphery of any one of adhesion areas 117 or in a case where the adhesive 16 has low viscosity, there is a risk that an extruded adhesive flows over the projection section 114 to thereby block the groove 118. In consideration of such case, the groove 118 may be formed to have a width larger than the particle size of the foreign object ($\leq 200$ μm).

This arrangement makes it possible to discharge the air inside the camera module 1' to the outside. Accordingly, the expansion of the air inside the camera module 1', which expansion is caused by undergoing solder heating and the like, can be prevented.

Note that an example where one groove 118 is provided in the camera module 1' has been described, however, the number of grooves 118 is not limited thereto. The number of grooves 118 can be arbitrarily set in accordance with a dimension of the camera module 1'.

[Embodiment 3]

The step for adhering the top surface section 111 and the glass substrate 12 to each other by applying the adhesive 16 to the extending sections 115 and the peripheries thereof has been described in the manufacturing method of Embodiment 1, however, the present invention is not limited thereto. In the present embodiment, a step for adhering a top surface section 111 and the glass substrate 12 to each other by applying an adhesive 16 to a glass substrate 12 will be described.

Figure 21:
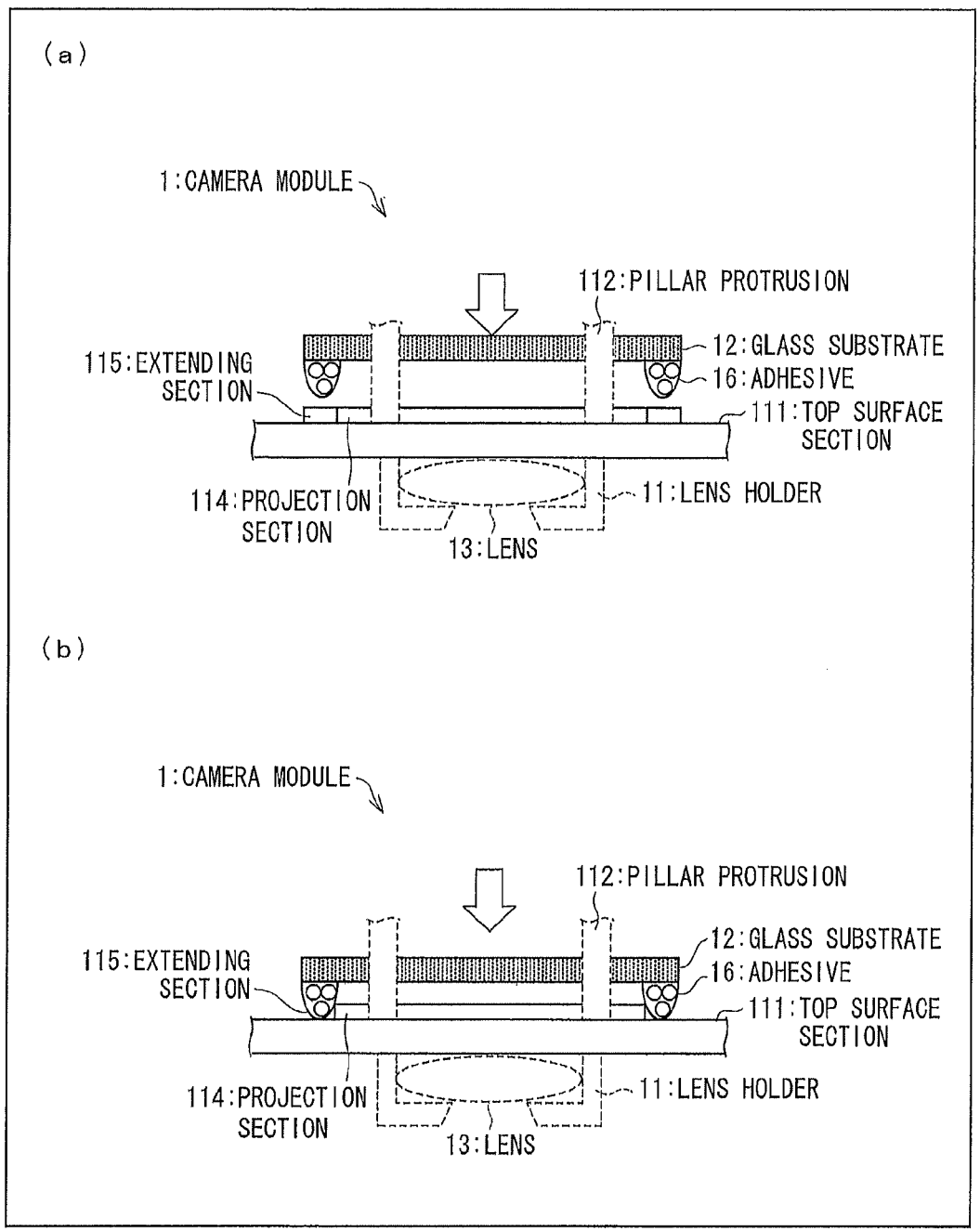
FIG. 21

(a) of FIG. 21 is a view illustrating a camera module 1 in which the adhesive 16 is applied to the glass substrate 12. As illustrated in (a) of FIG. 21, the adhesive 16 is applied to the glass substrate 12 in advance. In this case, it is preferable that a part to which the adhesive 16 is applied is a position where the extending sections 115 and the glass substrate 12 are brought into contact with each other. Next, the glass substrate 12 applied with the adhesive 16 is provided to the top surface section 111 as illustrated in (b) of FIG. 21. The glass substrate 12 is moved in downward direction (a direction in which the glass substrate 12 is directed to the top surface section 111) by a self-weight of the glass substrate 12 as illustrated by an arrow of (b) of FIG. 21. The glass substrate 12 is moved toward the height of a projection section 114 to be brought into contact with the projection section 114. Part of the adhesive 16 sandwiched between the glass substrate 12 and the top surface section 111 flows from the adhesion areas 117, on which the respective extending sections 115 are formed, into the step section 116, on which the projection section 114 is formed. Therefore, an area on which the adhesive 16 is flowed extends on the top surface section 111. In this way, the top surface section 111 and the glass substrate 12 are adhered to each other.

As described above, the camera module 1 in which the top surface section 111 and the glass substrate 12 are adhered to each other without generating any gap can be manufactured by the adhering step of the present embodiment.

Note that the top surface section 111 and the glass substrate 12 may be adhered to each other in such a manner that a surface of the glass substrate 12, which surface is opposite to a surface with which the top surface section 111 is in contact (i.e., a top surface section of the glass substrate 12 in (b) of FIG. 21) is pushed in the same way as Embodiment 1. In this way, the top surface section 111 and the glass substrate 12 can be fixedly attached to each other even if the viscosity of the adhesive 16 is high.

[Embodiment 4]

In the manufacturing method of the camera module 1 of each of Embodiments 1 and 3, the adhering step for applying the adhesive 16 to adhere the top surface section 111 and the glass substrate 12 to each other before placing the glass substrate 12 on the top surface section 111 has been described, however, the present invention is not limited thereto. In the present embodiment, an adhesive 16 is applied to adhere a top surface section 111 and a glass substrate 12 to each other after placing the glass substrate 12 on the top surface section 111 will be described.

Figure 22:
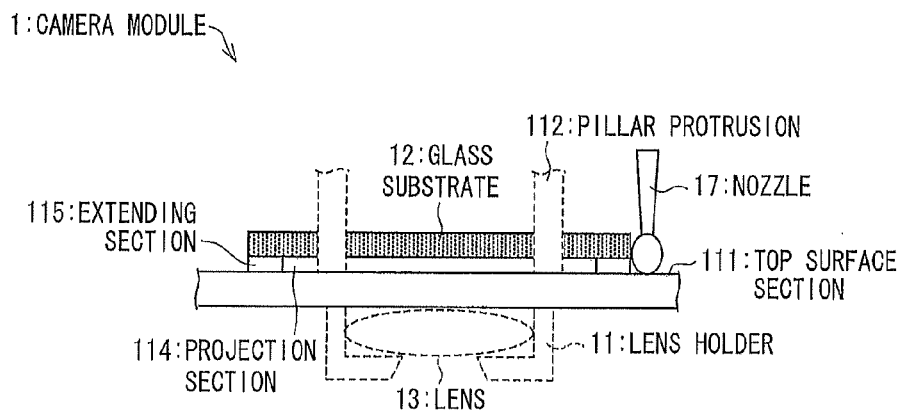
FIG. 22
Figure 23:
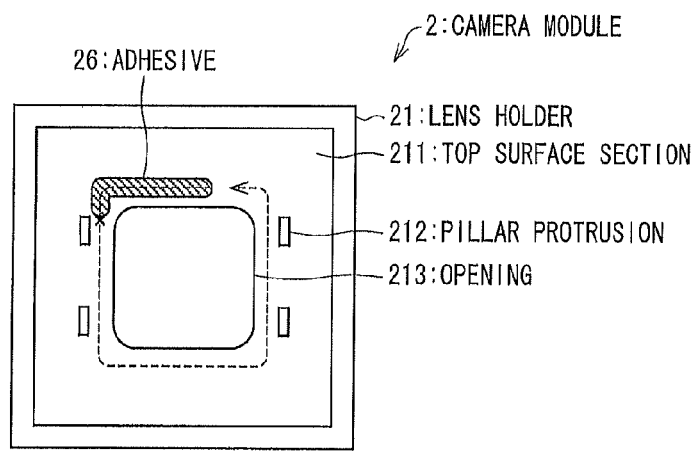
FIG. 23
Figure 24:
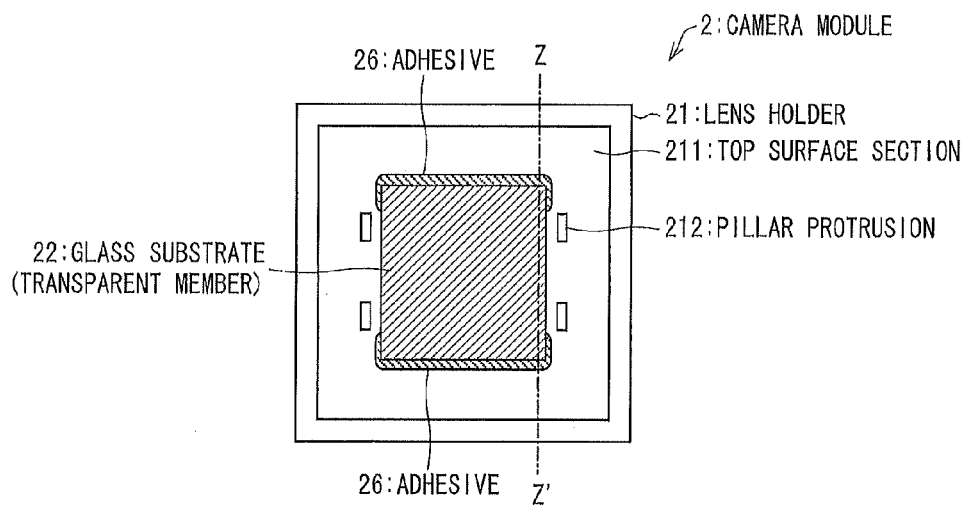
FIG. 24
Figure 25:
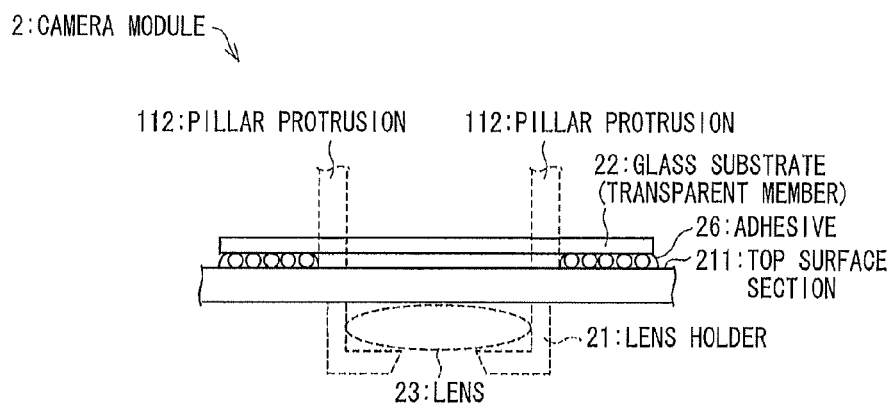
FIG. 25

FIG. 22 is a view of a camera module 1 in which a glass substrate 12 is provided to a top surface section 111 and the adhesive 16 is applied with use of a nozzle 17. As illustrated in FIG. 22, the glass substrate 12 is provided to the top surface section 111 in advance (placing step). After that, the adhesive 16 is applied to extending sections 115 of the top surface section 111 or peripheries thereof with use of the nozzle 17. The adhesive 16 is flowed along the extending sections 115 by capillary action which is caused by a space between the glass substrate 12 and the top surface section 111. The amount of adhesive is adjusted depending on how extensive the adhesive 16 is. In this way, the top surface section 111 and the glass substrate 12 are adhered to each other.

This makes it possible to adhere the top surface section 111 and the glass substrate 12 to each other, without extending the adhesive 16 to an undesired area.

Further, in a case of application of the adhesive 16, it is preferable to push a surface of the glass substrate 12, which surface is opposite to a surface with which the top surface section 111 is in contact (i.e., a top surface section of the glass substrate 12 in FIG. 22). Thus, it is prevented that the glass substrate 12 is apart from or shifted with respect to the top surface section 111 by receiving a pressure of the adhesive 16. In this way, the top surface section 111 and the glass substrate 12 can be fixedly attached to each other.

As described above, the present invention is greatly useful in providing the camera module 1 in which intrusion of a foreign object into an area for storing the lens 13 is blocked. The present invention can provide a greatly useful camera module 1 in which the projection section 114 prevents a foreign object from intruding into the area for storing the lens 13.

Preferable Embodiment of the Present Invention

As described above, an optical module of the present invention includes: a top surface section having an opening for allowing light to pass through the opening into the optical module; and a transparent member for sealing the opening, the transparent member being adhered to the top surface section, the top surface section including a projection section which projects to abut on the transparent member, the projection section being formed to surround the opening.

When adhering the top surface section and the transparent member to each other in the conventional arrangement, the top surface section and the transparent member may possibly be apart from each other at an adhesive part due to, for example, a filler basically contained in the adhesive for adhering the top surface section and the transparent member to each other. However, the present invention has such an arrangement that the projection section projecting from the top surface section and the transparent member abut on each other. Therefore, the top surface section and the transparent member can be provided without any gap. Further, the projection section is formed to surround the opening, so that a foreign object intruding from outside is blocked by the projection section. This arrangement makes it possible to prevent a foreign object from intruding into the optical module.

It is preferable that the optical module of the present invention further includes an image pick-up element, wherein the opening allows light to pass through the opening to the image pick-up element.

According to the aforementioned arrangement, the optical module functions as a camera module. As described above, it is greatly useful in providing the camera module which prevents a foreign object from intruding into the area for storing the image pick-up element. Here, according to the aforementioned arrangement, the projection section can prevent a foreign object from intruding into the area for storing the image pick-up element, so that the present invention can provide a greatly useful camera module.

It is preferable that, in the optical module of the present invention, the top surface section further includes extending sections, each of which extends from the projection section in a direction opposite to the opening.

The extending sections are provided in the aforementioned arrangement, so that the top surface section and the transparent member can be adhered to each other via the extending sections. This makes it possible to reduce an amount of the adhesive used for adhering the top surface section and transparent member to each other.

In the optical module of the present invention, the extending sections are preferably brought into line contact with the transparent member.

According to the aforementioned arrangement, the extending sections are brought into line contact with the transparent member, so that the adhesive for adhering the extending sections and the transparent member to each other is extruded between the extending sections and the transparent member. This can prevent a gap, which is caused by a residual filler etc. of the adhesive, from being generated between the extending sections and the transparent member, and can also suitably prevent a foreign object from intruding into the optical module.

The optical module of the present invention may be arranged such that the projection section has a substantially square shape or a substantially rectangular shape. In this case, the extending sections may extend from respective four corners of the projection section, or from respective four sides thereof.

According to the aforementioned arrangement, the extending sections are placed appropriately, so that the transparent member and the top surface section can be suitably adhered to each other.

In the optical module of the present invention, it is preferable that: the top surface section has adhesion areas to which an adhesive is applied; the adhesion areas include or are connected to the respective extending sections; and the top surface section and the transparent member are adhered to each other with use of the adhesive applied to the adhesion areas.

The adhesive is applied to such adhesion areas, and therefore the top surface section and the transparent member can be adhered to each other with such small adhesion areas, without greatly reducing the adhering strength.

In the optical module of the present invention, it is preferable that: the top surface section includes a step section for catching and holding the adhesive; and the step section surrounds the projection section.

The aforementioned arrangement can also catch and hold an adhesive that excessively applied.

The extending sections of the optical module of the present invention may extend from the projection section so as to have a straight shape, or may extend so as to have a curved shape.

According to the aforementioned arrangement, the extending sections are easy to catch and hold the adhesive in the peripheries of the extending sections, without remaining the adhesive on apexes thereof.

It is preferable that, in the optical module of the present invention, each of the extending sections is fully covered with the transparent member.

When each extending section has a dimension that can be covered with the transparent member, an adhesive excessively extruded from the extending section can be reduced as much as possible. In addition, the extending section having such dimension can lead to miniaturization of the optical module.

The projection section and the extending sections of the optical module of the present invention may have an equal height and different cross-sectional shapes vertical to a longitudinal direction thereof.

In a case where the projection section and each extending section have an equal height, the projection section and the transparent member abut on each other without any gap even if a cross-sectional shape of the projection section, in particular, a shape of an apex part of the projection section is different from that of each extending section. This makes it possible to prevent a foreign object from intruding into the optical module.

In the optical module of the present invention, the projection section and the transparent member may also be partially adhered to each other. For example, in a case where the optical module includes the extending sections, the projection section and the transparent member may be adhered to each other with use of the adhesive flowed into the projection section from the extending sections.

In the optical module of the present invention, the projection section may have a pointed apex part or a round apex part.

This makes it possible to suitably bring the projection section and the transparent member into contact with each other, and therefore to prevent a gap from being generated between the top surface section and the transparent member.

It is preferable that, in the optical module of the present invention, the projection section has a height equal to or larger than a particle size of a filler contained in the adhesive for adhering the top surface section and the transparent member to each other.

In a case where the height of the projection section is smaller than the particle size of an additive (solid additive) such as a filler contained in the adhesive, a difference between the height of the projection section and a height of the additive contained in the adhesive appears as a gap. In the present invention, the projection section has the height equal to or larger than the particle size of the additive contained in the adhesive, so that the gap is not generated.

The projection section of the optical module of the present invention may include a groove for discharging an air inside the optical module to outside.

The optical module is attached to a product substrate of a mobile phone etc. by undergoing solder heating and the like. In this case, the air inside the optical module may possibly expand. According to the aforementioned arrangement, the air inside the optical module can be discharged to the outside. The present invention can prevent the optical module from breaking down due to expansion of the air inside the optical module, which expansion is caused by the solder heating and the like.

Further, a method for manufacturing the optical module of the present invention, which method includes: a top surface section having an opening for allowing light to pass through the opening into the optical module, and transparent member for sealing the opening, the transparent member being adhered to the top surface section, the top surface section including a projection section which projects to abut on the transparent member, the projection section being formed to surround the opening, the method includes: an adhering step for adhering the top surface section and the transparent member to each other.

When adhering the top surface section and the transparent member to each other in the method, the top surface section and the transparent member may possibly be apart from each other at an adhesive part due to a filler basically contained in the adhesive for adhering the top surface section and the transparent member to each other. However, when the top surface section and the transparent member of the optical module having the arrangement are adhered to each other, the projection section projecting from the top surface section and the transparent member abut on each other. Therefore, the top surface section and the transparent member can be provided without any gap. Further, the projection section of the optical module of the aforementioned arrangement is formed to surround the opening, so that a foreign object intruding from the outside is blocked by the projection section. This arrangement makes it possible to manufacture the optical module which can prevent a foreign object from intruding into the optical module.

In the method of the present invention, the adhering step preferably includes: applying the adhesive to adhesion areas which (i) include the respective extending sections, each of which extends from the projection section in direction opposite to the opening or (ii) are connected to the extending sections, in order to adhere the top surface section and the transparent member to each other.

Further, in the method of the present invention, the adhering step may include placing the transparent member on the top surface section having the adhesive applied on the extending sections in order to seal the opening, and the top surface section and the transparent member are adhered to each other by a self-weight of the transparent member.

As to manufacturing of the optical module, the aforementioned arrangement can reduce an amount of the adhesive for adhering the top surface section and the transparent member to each other.

In the method of the present invention, the adhering step may include: applying the adhesive to the transparent member, in order to adhere the top surface section and the transparent member to each other.

Further, the method of the present invention may further include: prior to the adhering step, a placing step for placing the transparent member on the top surface section, wherein the adhering step includes: applying the adhesive to adhesion areas which (i) include the respective extending sections, each of which extends from the projection section in direction opposite to the opening or (ii) are connected to the extending sections, in order to adhere the top surface section and the transparent member to each other.

The optical module in which the top surface section and the glass substrate are adhered to each other without any gap can be manufactured by such adhering step.

In the method of the present invention, the adhering step may include: pushing a side of the transparent member, the side being not in contact with the top surface section, in order to adhere the top surface section and the transparent member to each other.

Accordingly, the top surface section and the transparent member can be further fixedly attached to each other.

The present invention is not limited to the description of the embodiments above, and may be modified in numerous ways by a skilled person as long as such modification falls within the scope of the claims. An embodiment based on a proper combination of technical means disclosed in different embodiments is encompassed in the technical scope of the present invention.

Industrial Applicability

The present invention can be utilized in a field of manufacturing general optical modules such as a mobile phone handset with camera function, a digital still camera, a security camera, and the like.

Reference Signs List 1, 1' camera module (optical module)
11 lens holder
111 top surface section
112 pillar protrusion
113 opening
114 projection section
115 extending section
116 step section
117 adhesion area
118 groove
12 glass substrate (transparent member)
13 lens
14 image pick-up section
141 image pick-up element
142 wire
15 wiring substrate
16 adhesive
161 solid additive
17 nozzle
2 camera module
21 lens holder
211 top surface section
212 pillar protrusion
213 opening
22 glass substrate (transparent member)

The invention claimed is:

1. An optical module, comprising:
a top surface section having an opening for allowing light to pass through the opening into the optical module; and
a transparent member for sealing the opening, the transparent member being adhered to the top surface section,
wherein the top surface section includes a projection section which projects to abut on the transparent member,
the projection section is formed to surround the opening,
the top surface section further includes extending sections, each of which extends from the projection section in a direction opposite to the opening, and
the top surface section has adhesion areas to which an adhesive is applied, the adhesion areas include or are connected to the respective extending sections, and the top surface section and the transparent member are adhered to each other with use of the adhesive applied to the adhesion areas.

2. The optical module as set forth in claim 1, further comprising:
an image pick-up element,
wherein the opening allows light to pass through the opening to the image pick-up element.

3. The optical module as set forth in claim 1, wherein the extending sections are brought into line contact with the transparent member.

4. The optical module as set forth in claim 1, wherein:
the projection section has a substantially square shape or a substantially rectangular shape; and
the extending sections extend from respective four corners of the projection section.

5. The optical module as set forth in claim 1, wherein:
the projection section has a substantially square shape or a substantially rectangular shape; and
the extending sections extend from respective four sides of the projection section.

6. The optical module as set forth in claim 1, wherein:
the top surface section includes a step section for catching and holding the adhesive; and
the step section surrounds the projection section.

7. The optical module as set forth in claim 1, wherein each of the extending sections extends from the projection section so as to have a straight shape.

8. The optical module as set forth in claim 1, wherein each of the extending sections extends from the projection section so as to have a curved shape.

9. The optical module as set forth in claim 1, wherein each of the extending sections is fully covered with the transparent member.

10. The optical module as set forth in claim 1, wherein the projection section and the extending sections have an equal height and different cross-sectional shapes vertical to a longitudinal direction thereof.

11. The optical module as set forth in claim 1, wherein the projection section and the transparent member are partially adhered to each other.

12. The optical module as set forth in claim 1, wherein the projection section has a pointed apex part.

13. The optical module as set forth in claim 1, wherein the projection section has a round apex part.

14. The optical module as set forth in claim 1, wherein the projection section has a height equal to or larger than a particle size of a filler contained in the adhesive for adhering the top surface section and the transparent member to each other.

15. The optical module as set forth in claim 1, wherein the projection section includes a groove for discharging an air inside the optical module to outside.

16. A method for manufacturing an optical module which includes a top surface section having an opening for allowing light to pass through the opening into the optical module, and a transparent member for sealing the opening, the transparent member being adhered to the top surface section, the top surface section including a projection section which projects to abut on the transparent member, the projection section being formed to surround the opening, the method comprising:

an adhering step for adhering the top surface section and the transparent member to each other, wherein the adhering step includes: applying the adhesive to adhesion areas which (i) include the respective extending sections, each of which extends from the projection section in direction opposite to the opening or (ii) are connected to the extending sections, in order to adhere the top surface section and the transparent member to each other, and each of the adhesion areas is provided at a location located in a direction opposite to the opening.

17. The method as set forth in claim 16, wherein:

the adhering step includes placing the transparent member on the top surface section having the adhesive applied on the extending sections in order to seal the opening; and the top surface section and the transparent member are adhered to each other by a self-weight of the transparent member.

18. A method for manufacturing an optical module which includes a top surface section having an opening for allowing light to pass through the opening into the optical module, and a transparent member for sealing the opening, the transparent member being adhered to the top surface section, the top surface section including a projection section which projects to abut on the transparent member, the projection section being formed to surround the opening, the method comprising:

an adhering step for adhering the top surface section and the transparent member to each other; and prior to the adhering step, a placing step for placing the transparent member on the top surface section, wherein the adhering step includes: applying the adhesive to adhesion areas which (i) include the respective extending sections, each of which extends from the projection section in direction opposite to the opening or (ii) are connected to the extending sections, in order to adhere the top surface section and the transparent member to each other, and each of the adhesion areas is provided at a location located in a direction opposite to the opening.

19. The method as set forth in claim 17, wherein the adhering step includes:

pushing a side of the transparent member, the side being not in contact with the top surface section, in order to adhere the top surface section and the transparent member to each other.

* * * * *